(12) United States Patent  
Carlson et al.

(10) Patent No.: US 6,713,997 B2  
(45) Date of Patent: Mar. 30, 2004

(54) POWER METERING MODULE

(75) Inventors: David C. Carlson, Rockvale, TN (US); M. Jason Thurmond, Murfreesboro, TN (US); Jeffrey J. Farago, Franklin, TN (US); Kenneth L. McMahon, Franklin, TN (US); Thomas J. Seifert, Mt. Juliet, TN (US); Robert C. Ditmore, Murfreeboro, TN (US); Avery D. Long, Lavergne, TN (US)

(73) Assignee: Square D Company, Palatine, IL (US)

( * ) Notice: Subject to any disclaimer, the term of this patent is extended or adjusted under 35 U.S.C. 154(b) by 8 days.

(21) Appl. No.: 09/780,799

(22) Filed: Feb. 9, 2001

(65) Prior Publication Data

US 2002/0109499 A1 Aug. 15, 2002

(51) Int. Cl.⁷ .................. G01R 11/00; G01R 35/04; G01R 21/06
(52) U.S. Cl. .................. 324/74; 324/142; 702/60
(58) Field of Search .................. 324/74, 142, 126, 324/127; 702/60, 61

(56) References Cited

U.S. PATENT DOCUMENTS 4,615,009 A * 9/1986 Battocletti et al. ............ 702/60
5,736,847 A * 4/1998 Van Doorn et al. .......... 324/142

OTHER PUBLICATIONS

"Powerlogic® Advanced Power Reliability Solutions," Square D Schneider Electric, brochure, 2000, 3 pages, month unavailable.

"Powerlogic® Circuit Monitor—Series 2000," Class 3020, Square D Schneider Electric, brochure, 3 pages, month, year unavailable.

"Powerlogic® Power Meter," Class 3020, Square D Schneider Electric, brochure, 1998, 2 pages, month unavailable.

"Powerlogic® Metering & Monitoring Devices," Square D Schneider Electric, brochure, 2000, 2 pages, month unavailable.

"Powerlogic® Power Monitoring and Control Systems," Square D Schneider Electric, brochure, 1998, 4 pages, month unavailable.

"Powerlogic® Series 4000 Circuit Monitor," Square D Schneider Electric, brochure, 2000, 3 pages, month unavailable.

"Powerlogic® System Architecture and Application Guide," Data Bulletin, Square D Schneider Electric, May 2000.

* cited by examiner

Primary Examiner—Kamand Cuneo
Assistant Examiner—Paresh Patel
(74) Attorney, Agent, or Firm—Larry I. Golden (57) ABSTRACT

A metering module for use in a power circuit monitoring system including a circuit monitor having a processor for processing data related to power signals, said metering module comprising at least one sensor for sensing a predetermined property of a power signal and for producing a corresponding sensor signal, and a modular metering circuit for producing data corresponding to said sensor signal for input into said circuit monitor, wherein said metering module is selectively detachable and replaceable relative to said circuit monitor to permit one or more of testing, calibration and repair of said metering module thereby minimizing any interruption in operation of said circuit monitor.

30 Claims, 8 Drawing Sheets

POWER METERING MODULE

BACKGROUND OF THE INVENTION

This invention is directed generally to the area of circuit monitoring, and more particularly to a novel and improved system for monitoring power signals in a power circuit, such as a residential or industrial, or aircraft power circuit.

The art of power circuit monitoring continues to develop. Long standing monitoring systems, for example for residential use, have in the past consisted of nothing more sophisticated than fuses, and more commonly, circuit breakers which have a given power/time characteristic so that the circuit is broken or switched to an open circuit condition, usually at a power distribution center or breaker box, when the current through the protected line exceeds the power/time characteristic of the circuit breaker or fuse component or the like. In many applications, and in particular in residential kitchen and bathroom applications, it has become common to provide a circuit breaker as part of an electrical outlet, such that the outlet is protected from current or voltage spikes. This again is commonly done with circuit breaker components which react to current spikes or time/current characteristics to open the circuit to the outlet. This removes power from the outlet and any appliances or other electrically powered equipment plugged into the outlet or merely from the outlet itself in the case of inadvertent contact with some foreign object or the like. In some instances, various appliances for home use are provided with circuit breaker-equipped power cords, which operate similarly to the circuit breaker outlet.

More recently still, arcing fault protection has become a consideration in the design of both residential and industrial electrical systems, as well as in aircraft electrical systems. In the case of arcing fault protection, a number of systems have been devised for reliably detecting arcing faults, and distinguishing these from normal arcing occurrences in some loads such as motors or the like, to prevent false trips as much as possible. Arcing faults generally fall into two categories, series and parallel. Series arcs generally occur when there is a break or fault in a conductor, and arcing develops across the break or fault as current continues to flow and potential builds up thereacross. In parallel arcing, arcing occurs between phase lines of a multi-phase power system or between one or more of phase lines and ground, in a single phase or multi-phase system. This may occur, for example, when the insulation of conductors becomes broken or damaged in some manner. Systems have been developed by Square D Company, the owner of this application, to reliably detect arcs of both types, as well as ground faults and other electrical faults, and to provide systems to rapidly and reliably trigger or trip circuit breakers in response to such electrical faults. Power monitoring systems include systems for mounting at power distribution centers or breaker boxes, as well as systems which can be mounted at individual outlets to provide protected outlets. Power monitoring systems may also be associated with appliances, for example, built in to appliance cords or electrical connectors affixed to the end of appliance cords, as well as in junction boxes, dimmer switches, smoke detectors and other electrical equipment. Square D Company has also provided and/or proposed novel and useful fault protection systems for use in aircraft for detecting and protecting against arcing faults, ground faults and other electrical faults.

In our currently proposed power monitoring systems for use in such electrical fault protection systems, generally speaking, a monitoring circuit is provided which utilizes a processor to process digital signals which are related to power signals detected by various sensors on one or more power lines to be monitored. Heretofore, circuit monitoring systems have been provided in various forms, however, usually integrated into a single monitoring apparatus contained in a single housing. However, with increasing regulatory requirements upon the performance of circuit monitoring systems, it may become necessary to provide for calibration of various circuit components of a system, so as to maintain metering accuracy. The testing and calibration of a circuit monitoring system installed in the field may be a difficult proposition. While a circuit monitoring system may be factory calibrated, it is difficult to easily and simply retest and recalibrate the system, if necessary, in the field. Such testing and monitoring would require shutting down the circuit monitoring system for some period of time, thus, correspondingly either shutting down power on the lines being monitored or providing unmonitored, unprotected service during the period of testing. Neither of these options is particularly attractive or acceptable.

OBJECTS AND SUMMARY OF THE INVENTION

Accordingly, it is a general object of this invention to provide a novel and improved power monitoring system which solves the above-noted problem of calibrating and testing.

Briefly, in accordance with the foregoing object, a power monitoring system comprises a circuit monitor having a processor for processing data related to power signals; and a metering module comprising at least one sensor for sensing a predetermined property of a power signal and for producing a corresponding sensor signal, and a modular metering circuit for producing data corresponding to said sensor signal for input into said circuit monitor, wherein said metering module is selectively detachable and replaceable relative to said circuit monitor to permit one or more of testing, calibration and repair of said metering module without interrupting operation of said circuit monitor for any longer than necessary to remove one metering module and replace it with another metering module.

In accordance with another aspect of the invention, a metering module for use in a power circuit monitoring system including a circuit monitor having a processor for processing data related to power signals, comprises at least one sensor for sensing a predetermined property of a power signal and for producing a corresponding sensor signal, and a modular metering circuit for producing data corresponding to said sensor signal for input into said circuit monitor, wherein said metering module is selectively detachable and replaceable relative to said circuit monitor to permit one or more of testing, calibration and repair of said metering module without interrupting operation of said circuit monitor for any longer than necessary to remove one metering module and replace it with another metering module.

In accordance with another aspect of the invention, a power monitoring method comprises processing data related to power signals at a circuit monitor, and sensing a predetermined property of a power signal and producing a corresponding sensor signal, and producing data corresponding to said sensor signal for input into said circuit monitor a metering module, and selectively detaching and replacing said metering module relative to said circuit monitor to permit one or more of testing, calibration and repair of said metering module without interrupting operation of said circuit monitor for any longer than necessary to remove one metering module and replace it with another metering module.

In accordance with another aspect of the invention, a metering method is provided for use in a power circuit monitoring system including a circuit monitor having a processor for processing data related to power signals, said metering method comprising, at a metering module, sensing a predetermined property of a power signal and producing a corresponding sensor signal, and producing data corresponding to said sensor signal for input into said circuit monitor, and selectively detaching and replacing said metering module relative to said circuit monitor to permit one or more of testing, calibration and repair of said metering module without interrupting operation of said circuit monitor for any longer than necessary to remove one metering module and replace it with another metering module.

DETAILED DESCRIPTION OF THE ILLUSTRATED EMBODIMENT

Figure 1:
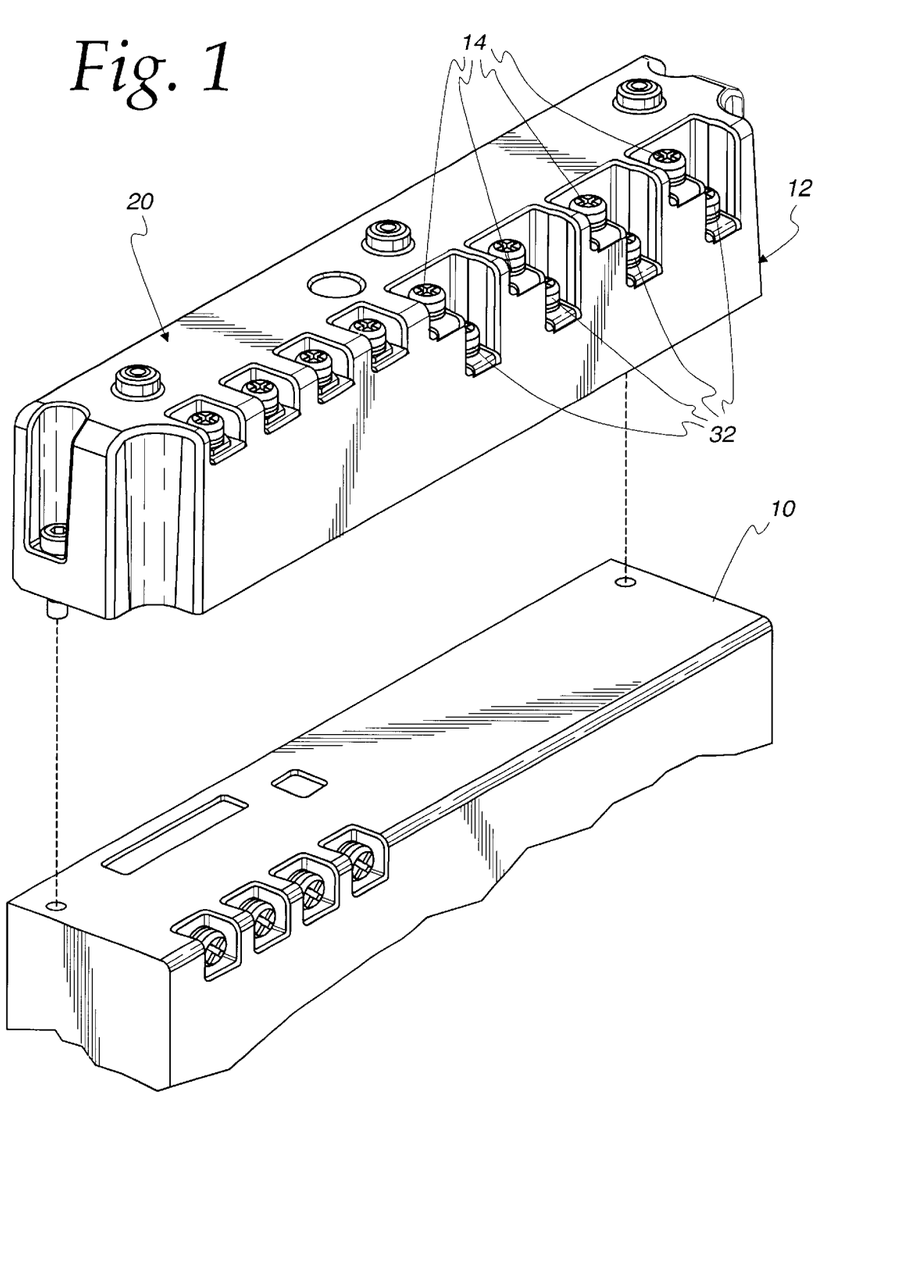
FIG. 1 is an isometric view of a metering module in accordance with one form of the invention, together with a somewhat diagrammatic representation of a power circuit monitoring system.

Referring initially to FIG. 1, a power monitoring system in accordance with one aspect of the invention includes a circuit monitor or monitoring module 10 and a metering module 12. In accordance with a feature of the invention, the metering module 12 is modular in construction and is easily removable and reattachable with respect to the circuit monitor 10. The metering module, as will be more fully described below, is designed to be connected directly to power lines including both voltage lines and current lines, or to current or potential transformers. Unlike auxiliary current transformers used by some embedded (i.e., non-modular) metering systems, the metering module 12 itself contains all of the preconditioning circuit for voltage and current signals. Thus, one or more power lines to be monitored may connect directly to the module 12, for example at terminals 14.

As will be seen presently, the metering module 12 contains all of the circuitry, including, in the illustrated embodiment, analog-to-digital converters, for enabling the circuit monitor 10 to digitally process data from the one or more power lines to be monitored. In this regard, the metering module 12 may contain all of the components needing to be calibrated or characterized or evaluated by a calibration procedure. Thus, the metering module is such that it may be readily removed from the circuit monitor 10 and replaced with a like and previously calibrated metering module, to minimize downtime of the circuit monitor and the associated power monitoring system as well as the associated power line(s). The removed metering module may then be tested, recalibrated, recharacterized or repaired as necessary and reinstalled on this or another circuit monitor. Also, in this regard updated versions of the metering module, or different versions, to be used for different specific current/voltage monitoring functions may also be exchanged one for one with an existing metering module 12 in view of their modular installation relative to the circuit monitor 10, as described above.

Figure 2:
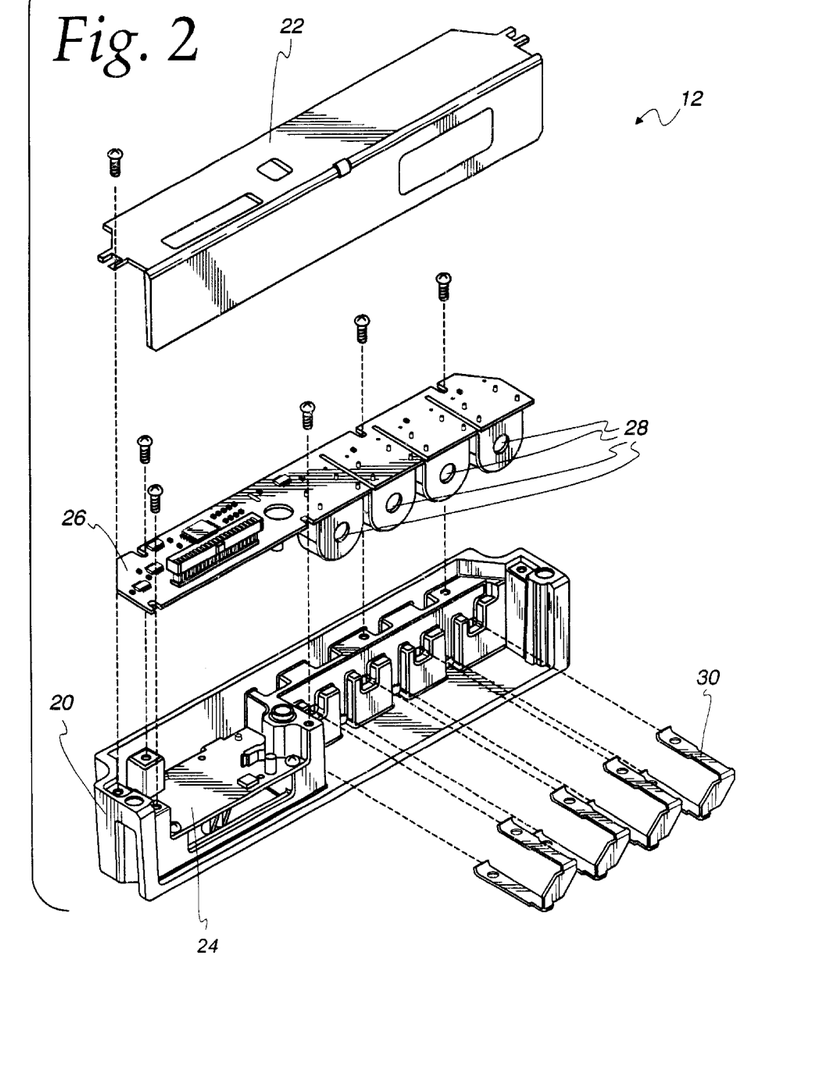
FIG. 2 is an exploded view showing a number of components of a metering module of FIG. 1.

Referring briefly to FIG. 2, in accordance with one embodiment of the invention, the metering module 12 may include upper and lower module housing portions 20 and 22. In this regard, it is noted that the direction of the view of FIG. 2 is opposite that of FIG. 1, FIG. 1 being a top isometric view and FIG. 2 being a bottom isometric view. A printed circuit board 26 and a second printed circuit board 24 may hold all of the electrical and electronic components for monitoring and processing both voltage and current signals, and for outputting signals in digital form for further processing by the circuit monitor 10. The circuit board 26 also mounts a plurality of current transformer coils 28.

A number of straps or U-shaped connectors 30 are provided for delivering current from one or more external terminals 14 through the central through openings of the current transformer coils 28 and back out again to the monitored circuit at similar terminals 32 (see FIG. 1). Thus, the conductor of a circuit to be monitored is interrupted or cut at the metering module 12 and, coupled to the terminal 14 and to the terminal 32, so that it may be monitored by the current transformers 28. The current transformers 28 may also be arranged to monitor voltage on the lines running therethrough. Alternatively, current and/or voltage may be monitored by other circuits directly from the connecting points to the terminals 14 and/or 32.

Figure 3:
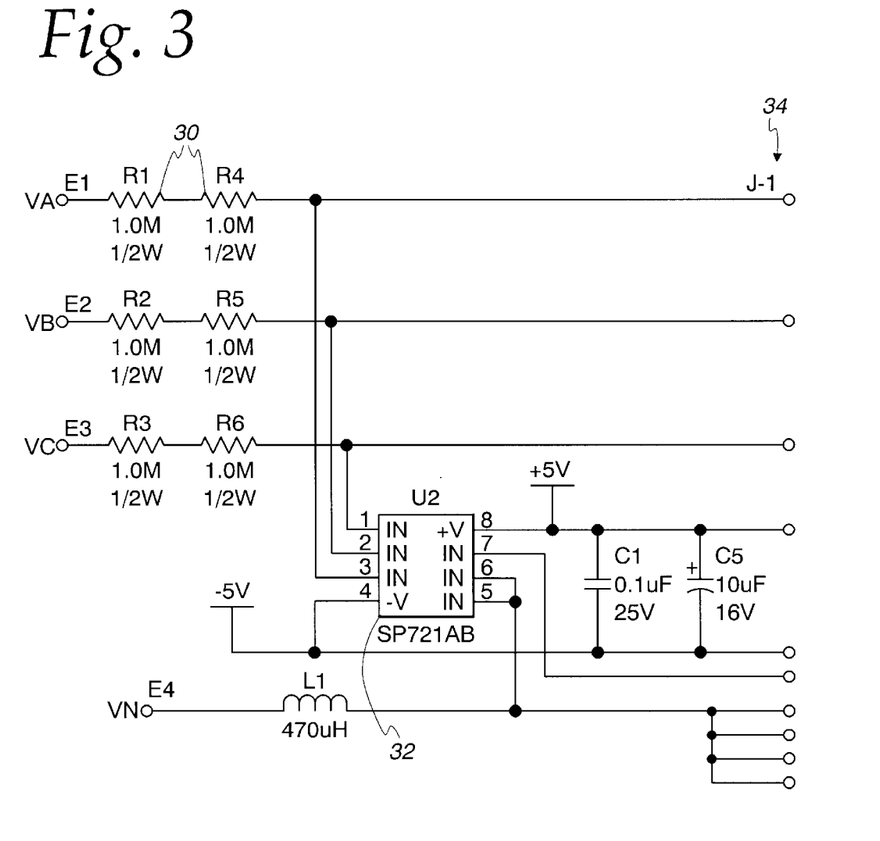
FIG. 3 is a circuit schematic showing a portion of a voltage monitoring circuit of the metering module.
Figure 4A:
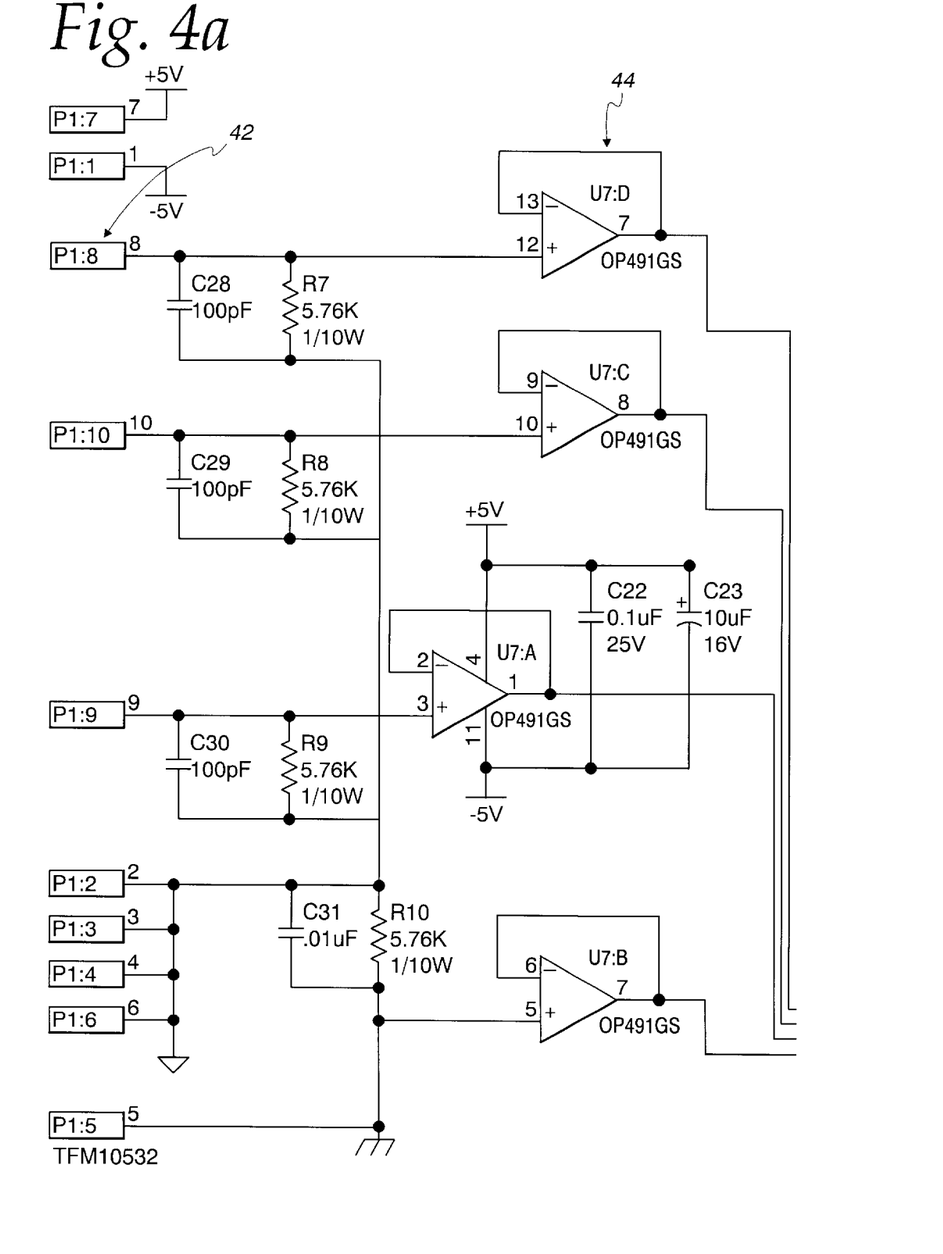
FIGS. 4a and 4b illustrate a further portion of a voltage monitoring circuit of the metering module.
Figure 4B:
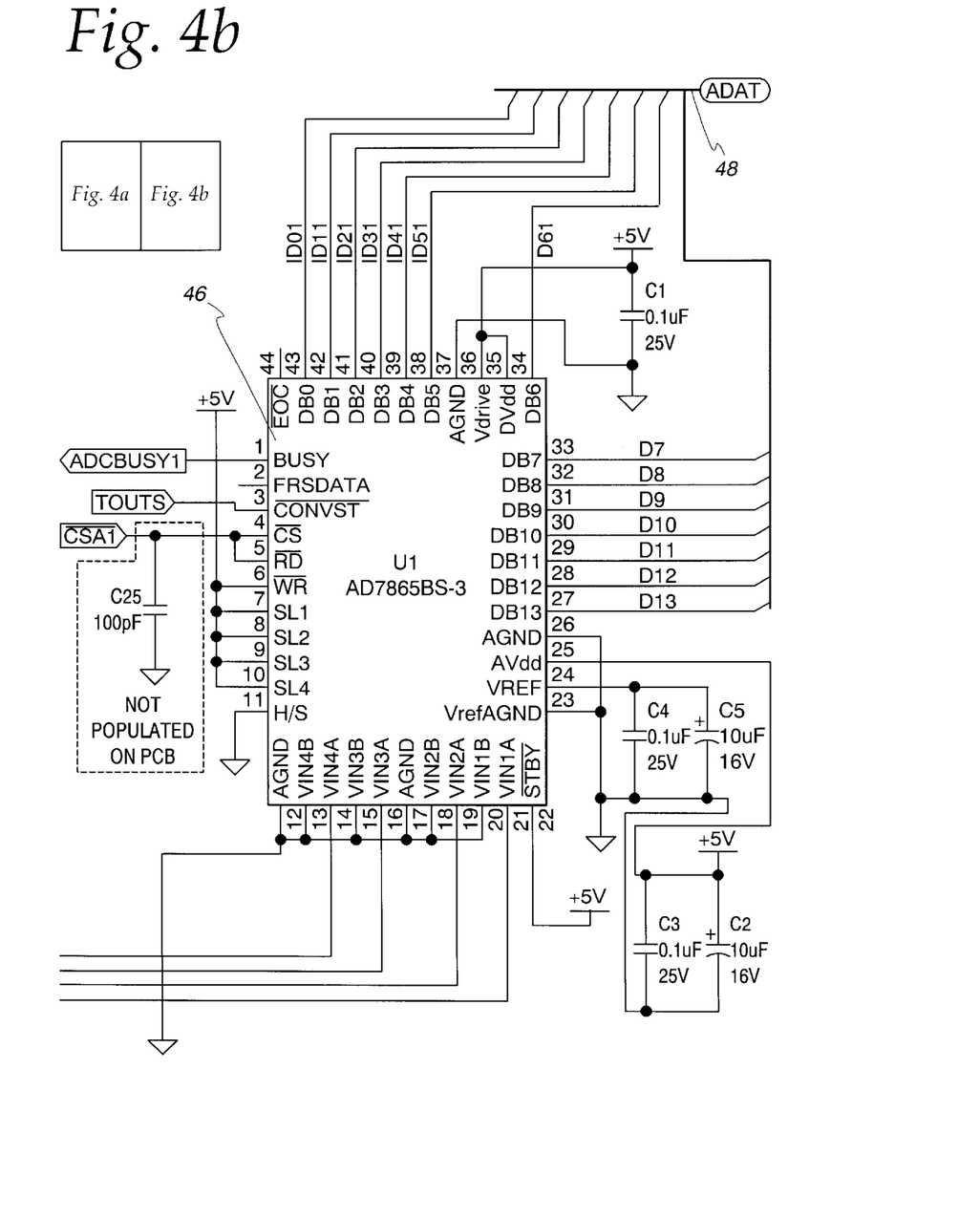

Referring next to FIGS. 3 and 4a–4b, a voltage monitoring circuit is shown. In the illustrated embodiment, the circuit of FIG. 3 is relatively simple, employing a number of series resistors 30 and a electrostatic discharge protection device 32, which may be an integrated circuit component of the type designated SP721AB. This circuit portion may be mounted as the second printed circuit board 24.

Referring to FIGS. 4a and 4b, a voltage processing circuit is shown. Respective inputs 42 of the circuit coupled to outputs 34 of FIG. 3, and are delivered to respective operational amplifiers or opamps 44. The opamps 44 in turn feed their outputs to a four channel simultaneous 14-bit analog-to-digital (A to D) converter 46 which provides digital outputs on a plurality of digital lines, here illustrated as a single cable 48. The A to D converter 46 may be of an Analog Devices type AD7865BS-3.

Figure 5A:
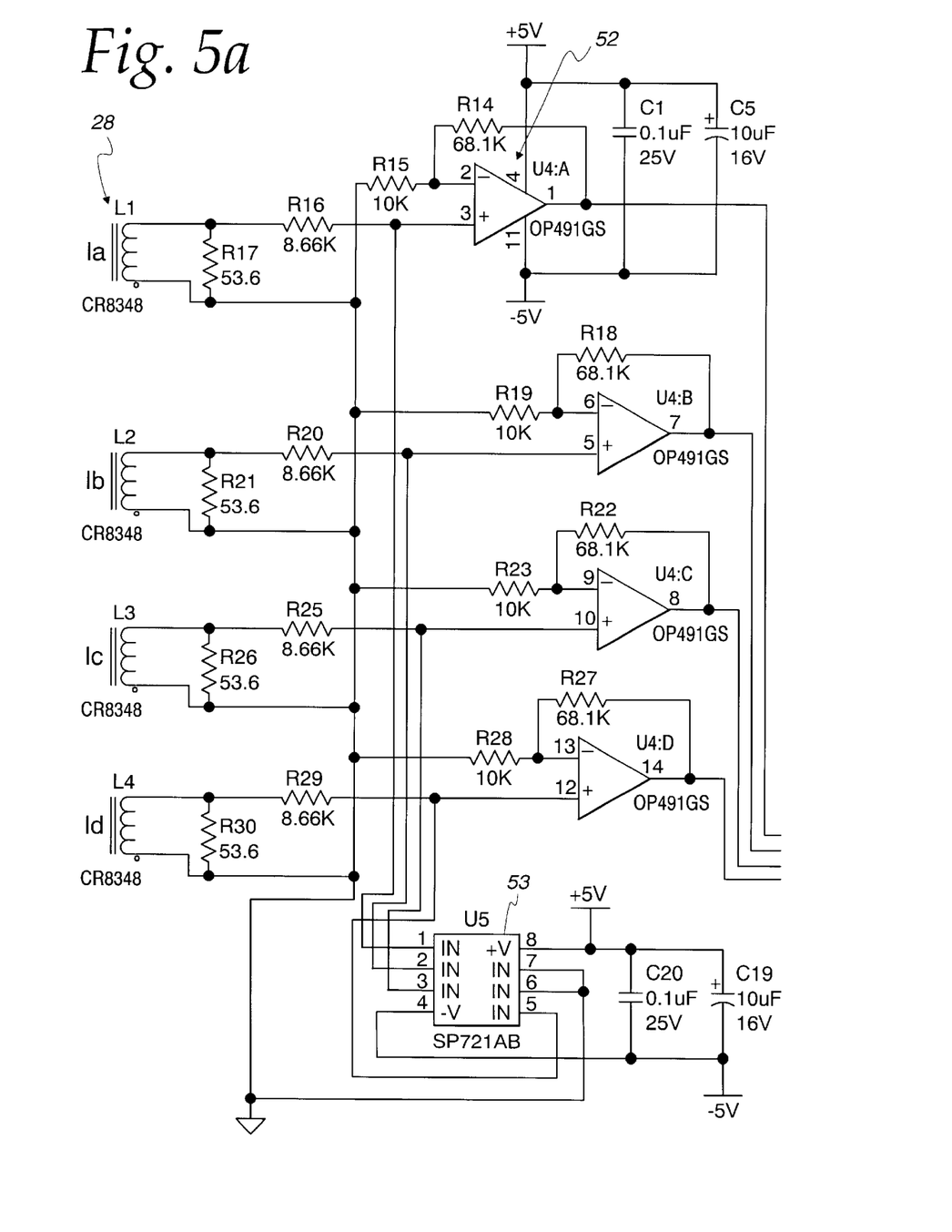
FIGS. 5a and 5b illustrate a current monitoring circuit thereof.
Figure 5B:
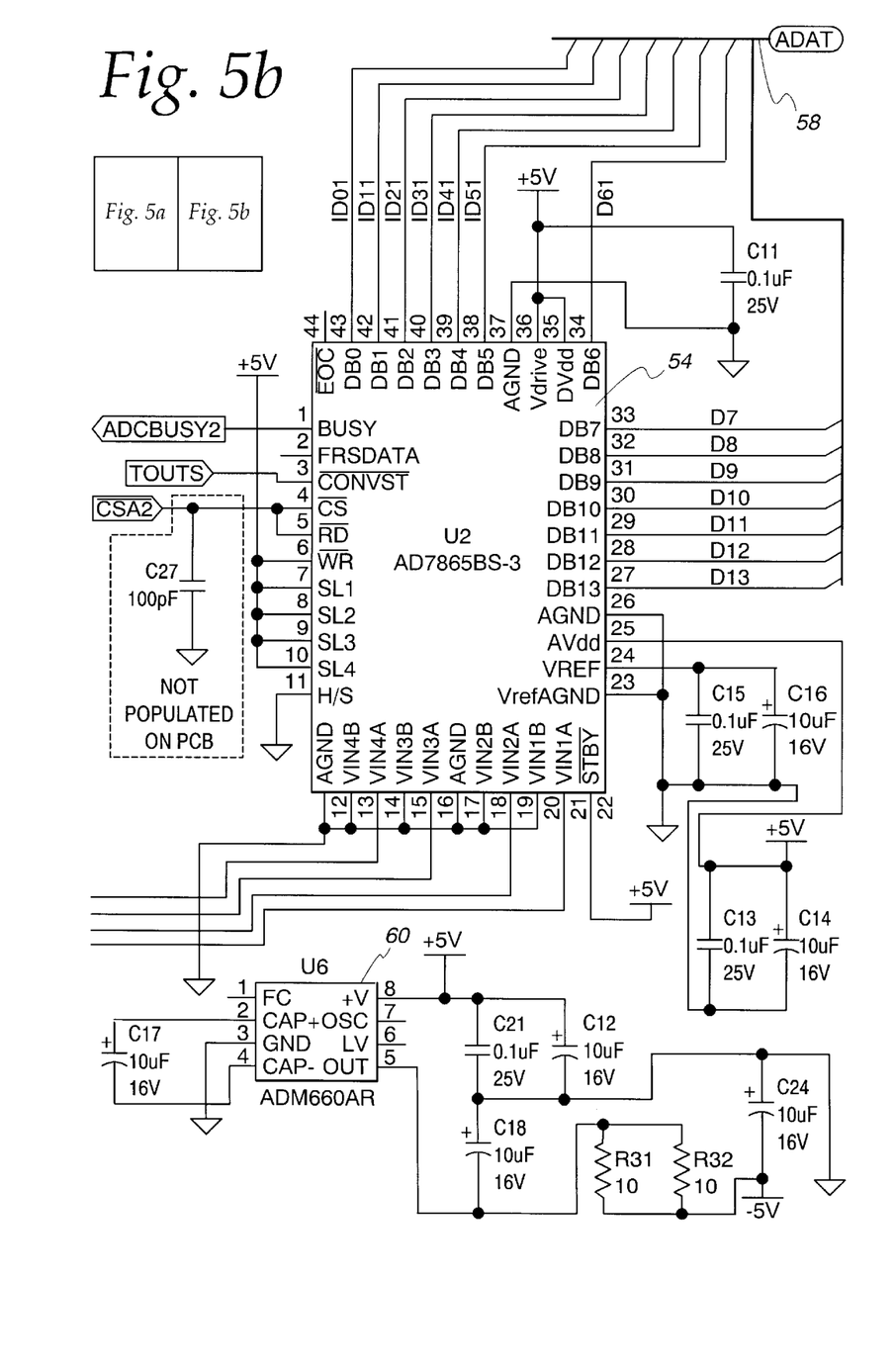

In FIGS. 5a and 5b, the outputs of the current transformers 28 are fed to a group of similar operational amplifiers or opamps 52. These opamps may be Analog Devices opamps of the type generally designated OP491GS, as may the opamps 44 in FIG. 4a. The outputs of these operational amplifiers are in turn fed to a second and similar analog-to-digital converter 54 which may be an Analog Devices type AD7865BS-3. This A to D converter 54 feeds a second group of digital output lines 58. A regulated voltage supply 60 may take the form of a negative high voltage IC charge pump of the type made by Analog Devices, type ADN660AR. Additionally, a second, similar electrostatic discharge protection device 53 of the type SP721AB may also be provided in the circuit of FIG. 5a.

Figure 6:
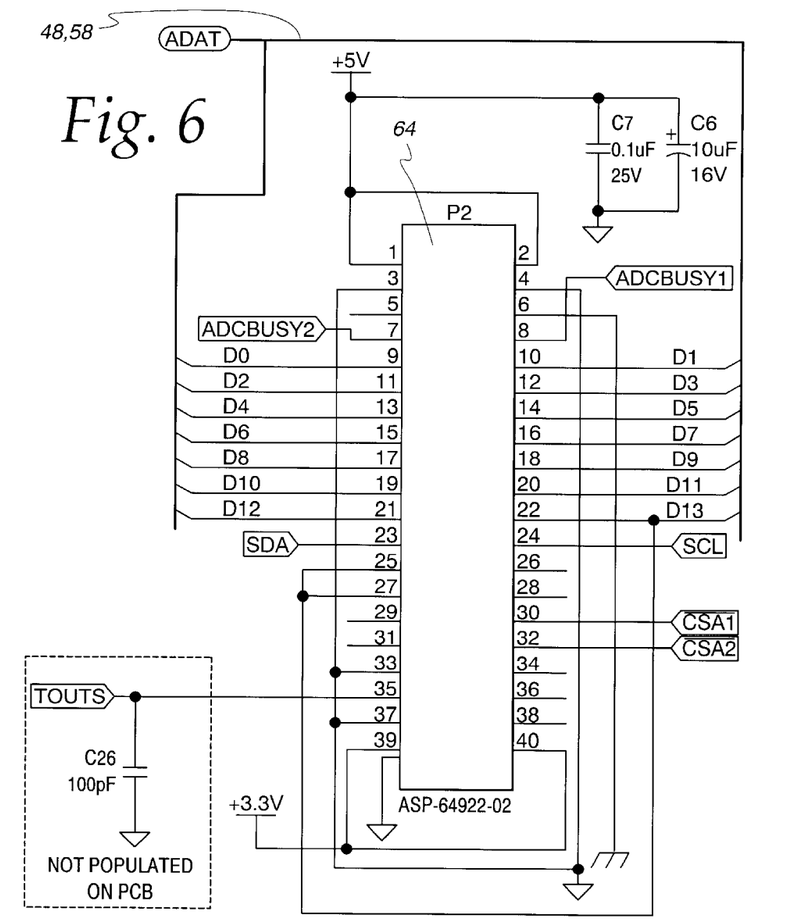
FIG. 6 illustrates yet a further portion of a current monitoring circuit.

As shown in FIG. 6, the respective digital signal line outputs 48 and 58 are delivered to a connector 64 which in the illustrated embodiment is of the type manufactured by SamTech type ASP-64922-02. The metering module 12 also receives power from the circuit monitor 10 by means of connector 64, power signals (+5 V, +3.3 V and GND are indicated in this embodiment). This connector may couple with a complimentary connector (not shown) of the circuit monitor module 10 of FIG. 1.

Figure 7:
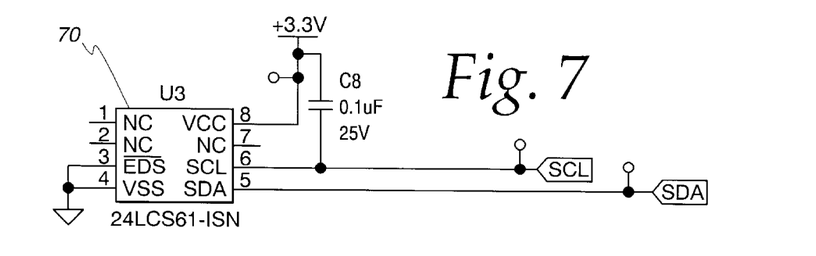
FIG. 7 shows a non-volatile memory for the metering module of the invention.

FIG. 7 illustrates a non-volatile memory 7 which in the illustrated embodiment is an EEPROM made by Microchip, of the type generally designated 24 LCS61-ISN, which is a serial 1K EEPROM. This memory may store analog-to-digital conversion factors for enabling the circuit monitor to digitally process the data provided by the metering module. The non-volatile memory 70 may also store calibration coefficients to enhance metering accuracy.

The circuits of FIGS. 4a and 4b and 5a and 5b and 6 are contained on the "current" board 28. However, as noted the circuits of FIGS. 4a and 4b constitute a part of the voltage signal processing circuitry of the metering module.

The circuits of FIGS. 4a and 4b and 5a and 5b are contained on the second circuit board 24. However, as noted the circuits of FIGS. 4a and 4b constitute a part of the voltage signal processing circuitry of the metering module.

In operation, the metering module 12 may receive and respond to control signals from the circuit monitor 10, and may also receive power from the circuit monitor (e.g., power for the regulator 60).

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. A power monitoring system comprising:
   a circuit monitor having a processor for processing data related to power signals; and
   a metering module comprising:
      a housing;
      at least one sensor for sensing a predetermined property of a power signal and for producing a corresponding sensor signal; and
      a modular metering circuit for producing data corresponding to said sensor signal for input into said circuit monitor;
      wherein said metering module is separately housed, detachable and replaceable relative to said circuit monitor to permit one or more of testing, calibration and repair of said metering module independently of said circuit monitor.

2. The system of claim 1 wherein said modular metering circuit further includes at least one analog to digital converter for digitizing said sensor signal.

3. The system of claim 1 wherein said modular metering circuit further comprises substantially all of a set of preconditioning circuitry for power signals, including substantially all components requiring calibration, in order to maintain accuracy of the metering module.

4. The system of claim 1 wherein said property of a power signal comprises one or more voltages.

5. The system of claim 1 wherein said property of a power signal comprises one or more currents.

6. The system of claim 4 wherein said property of a power signal comprises one or more currents.

7. The system of claim 1 wherein said metering module is responsive to control signals, and receives power from said circuit monitor.

8. The system of claim 1, said metering module and further including a non-volatile memory for storing calibration coefficients and analog-to-digital factors.

9. A metering module for use in a power circuit monitoring system including a circuit monitor having a processor for processing data related to power signals, said metering module comprising:
   at least one sensor for sensing a predetermined property of a power signal and for producing a corresponding sensor signal; and
   a modular metering circuit for producing data corresponding to said sensor signal for input into said circuit monitor;
   wherein said metering module is separately housed, detachable and replaceable relative to said circuit monitor to permit one or more of testing, calibration and repair of said metering module independently of said circuit monitor.

10. The system of claim 9 wherein said modular metering circuit further includes at least one analog to digital converter for digitizing said sensor signal.

11. The system of claim 9 wherein said modular metering circuit further comprises substantially all of a set of preconditioning circuitry for power signals, including substantially all components requiring calibration, in order to maintain accuracy of the metering module.

12. The system of claim 9 wherein said property of a power signal comprises one or more voltages.

13. The system of claim 9 wherein said property of a power signal comprises one or more currents.

14. The system of claim 12 wherein said property of a power signal comprises one or more currents.

15. The system of claim 9 wherein said metering module is responsive to control signals, and receives power from said circuit monitor.

16. The metering module of claim 8 and further including a non volatile memory for storing calibration coefficients and analog-to-digital factors.

17. A power monitoring method comprising:
   processing data related to power signals at a circuit monitor; and
   a metering module comprising:
      sensing a predetermined property of a power signal and for producing a corresponding sensor signal; and
      producing data corresponding to said sensor signal for input into said circuit monitor; and
      separately housing, detaching and replacing said metering module relative to said circuit monitor to permit one or more of testing, calibration and repair of said metering module independently of said circuit monitor.

18. The method of claim 17 further including digitizing said sensor signal at said metering module.

19. The method of claim 17 wherein said predetermined property of a power signal comprises one or more voltages.

20. The method of claim 17 wherein said predetermined property of a power signal comprises one or more currents.

21. The method of claim 19 wherein said predetermined property of a power signal comprises one or more currents.

22. The method of claim 17 wherein said control module providing control signals and power for said metering module.

23. The method of claim 17 and further including storing calibration coefficients and analog-to-digital conversion factors in a non-volatile memory at said metering module.

24. A method of metering for use in a power circuit monitoring system including a circuit monitor having a processor for processing data related to power signals, said metering method comprising:

sensing a predetermined property of a power signal and for producing a corresponding sensor signal; and producing data corresponding to said sensor signal for input into said circuit monitor; and separately housing, detaching and replacing said metering module relative to said circuit monitor to permit one or more of testing, calibration and repair of said metering module independently of said circuit monitor.

25. The method of claim 24 wherein said metering module circuit further includes an analog to digital converter for digitizing said sensor signal.

26. The method of claim 24 wherein said predetermined property of a power signal comprises one or more voltages.

27. The method of claim 24 wherein said predetermined property of a power signal comprises one or more currents.

28. The method of claim 26 wherein said predetermined property of a power signal comprises one or more currents.

29. The method of claim 25 wherein said metering module providing control signals and power for said metering module.

30. The method of claim 24 and further including storing calibration coefficients and analog-to-digital conversion factors in a non-volatile memory at said metering module.

* * * * *